United States Patent [19]

Peterson

[11] Patent Number: 5,345,113
[45] Date of Patent: Sep. 6, 1994

[54] CONTROL MODULE FOR REDUCING RINGING IN DIGITAL SIGNALS ON A TRANSMISSION LINE

[75] Inventor: LuVerne R. Peterson, San Diego, Calif.

[73] Assignee: Unisys Corporation, Blue Bell, Pa.

[21] Appl. No.: 64,511

[22] Filed: May 19, 1993

[51] Int. Cl.$^5$ .............................................. H03K 17/16
[52] U.S. Cl. ..................................... 307/475; 307/443; 307/547
[58] Field of Search ............... 307/443, 448, 451, 475, 307/530, 273, 547, 550; 375/60, 104

[56] References Cited

U.S. PATENT DOCUMENTS

| | | | |
|---|---|---|---|
| 5,153,457 | 10/1992 | Martin et al. | 307/475 X |
| 5,227,677 | 7/1993 | Furman | 307/443 |
| 5,248,906 | 9/1993 | Mahmood | 307/475 X |
| 5,287,022 | 2/1994 | Wilshen | 307/475 X |
| 5,296,758 | 3/1994 | Sandhu | 307/475 X |
| 5,298,804 | 3/1994 | Shichinohe | 307/451 X |

Primary Examiner—David R. Hudspeth
Attorney, Agent, or Firm—Fassbender Charles J.; Mark T. Starr; Stanton D. Weinstein

[57] ABSTRACT

An electronic control module reduces ringing in the digital signals on a transmission line which has multiple transmitters, receivers, and parasitic inductors and capacitors coupled to the line. Preferably, a copy of this control module is provided at each node on the line which has a transmitter and/or receiver. Each copy of the control module has three main parts—a sensing circuit, a pulse generating circuit, and a switching circuit. The sensing circuit is coupled to the transmission line, and it generates a control signal when the digital signal on the transmission line changes from a low voltage to a high voltage. The pulse generating circuit receives the control signal and responds by generating a single pulse. The switching circuit receives the pulse and, in response, couples a high supply voltage to the transmission line while the pulse occurs.

13 Claims, 7 Drawing Sheets

FIG. 9

CONTROL MODULE FOR REDUCING RINGING IN DIGITAL SIGNALS ON A TRANSMISSION LINE

BACKGROUND OF THE INVENTION

This invention relates to digital systems in which multiple transmitters and multiple receivers are interconnected to each other on a transmission line; and more particularly, it relates to circuits for reducing ringing in the signals that are sent over such a transmission line.

In many digital systems of the prior art, several functional units are interconnected to each other over a data bus. This bus includes a plurality of transmission lines which carry respective digital signals in parallel. Each transmission line of the bus goes to all of the units in the digital system, and all the units provide a respective transmitter or receiver, or both, for each transmission line.

With such a system, it is desirable to be able to transmit data over the bus from one unit to another at a high rate. However, each of the transmission lines which make up the bus will inherently have a parasitic inductance, resistance, and capacitance; and that will limit the speed at which transmissions on the bus can occur. In particular, the parasitic inductance and capacitance of a transmission line can cause the signals on the line to ring when they switch from a one voltage state (e.g.—low) to another (e.g.—high). Such ringing must be allowed to settle before the data on the transmission line can be received; and that adds to the total transmission time.

In the prior art, this problem is addressed by U.S. Pat. No. 5,023,488 issued Jun. 11, 1991 to Gunning. FIG. 1 of this patent shows a digital system in which a transmission line has multiple transmitters and receivers connected to it; FIG. 4 shows a circuit diagram for each transmitter on the transmission line; and the FIG. 4 transmitter is structured to compensate for ringing. This is pointed out by Gunning at column 2, lines 48–59.

However, one problem with the Gunning transmitter is that in order to reduce ringing on the transmission line, the rise time of the transmitter output signal is increased (i.e.—the slope of the signal is decreased). This does reduce ringing on the transmission line; however, as the transmitter output signal travels down the transmission line, the signal's rise time is decreased even further by the parasitic capacitance and resistance of the line. Thus, the time for the signal to reach a reference level at which it is interpreted as a digital high, gets larger and larger. Further, as the signal rise time increases, the time delay through a receiver which detects when the signal is at the reference level, increases.

Also, another drawback of the Gunning transmitter is that the compensation which the transmitter provides is only applied by one transmitter at a time on the transmission line. That is, only one transmitter at a time can send signals on the transmission line, and the Gunning transmitter can compensate for ringing only if it is doing the sending. However, a ringing signal sent by one transmitter will propagate along the entire length of the transmission line to all of the other transmitters and receivers, and there delay the signals reception.

Accordingly, a primary object of the invention is to provide an electronic control module at each transmitter on a transmission time, which reduces ringing in a signal from one transmitter as the signal passes by every transmitter, and which does so without slowing down the switching speed of any transmitter.

BRIEF SUMMARY OF THE INVENTION

In accordance with the present invention, an electronic control module is provided that reduces ringing in the digital signals on a transmission line which has multiple transmitters, receivers, and parasitic inductors, resistors, and capacitors coupled to the line. Preferably, a copy of this control module is provided at each node on the line which has a transmitter and/or receiver. Each copy of the control module has three main parts—a sensing circuit, a pulse generating circuit, and a switching circuit. The sensing circuit—a) has an input coupled to the transmission line, b) senses when the digital signal on the transmission line changes from a low voltage to a high voltage, and c) generates a control signal to indicate that change. The pulse generating circuit—a) has an input which receives the control signal, and b) responds to the control signal by generating a single pulse. The switching circuit—a) has an input which receives the pulse, and b) an output which couples a high supply voltage to the transmission line while the pulse occurs. This coupling of the supply voltage to the line, by each control module, substantially reduces ringing—even when the transmission line voltage changes from low to high very quickly.

BRIEF DESCRIPTION OF THE DRAWINGS

Various embodiments of the invention are described herein in conjunction with the accompanying drawings wherein.

DETAILED DESCRIPTION

Figure 1:
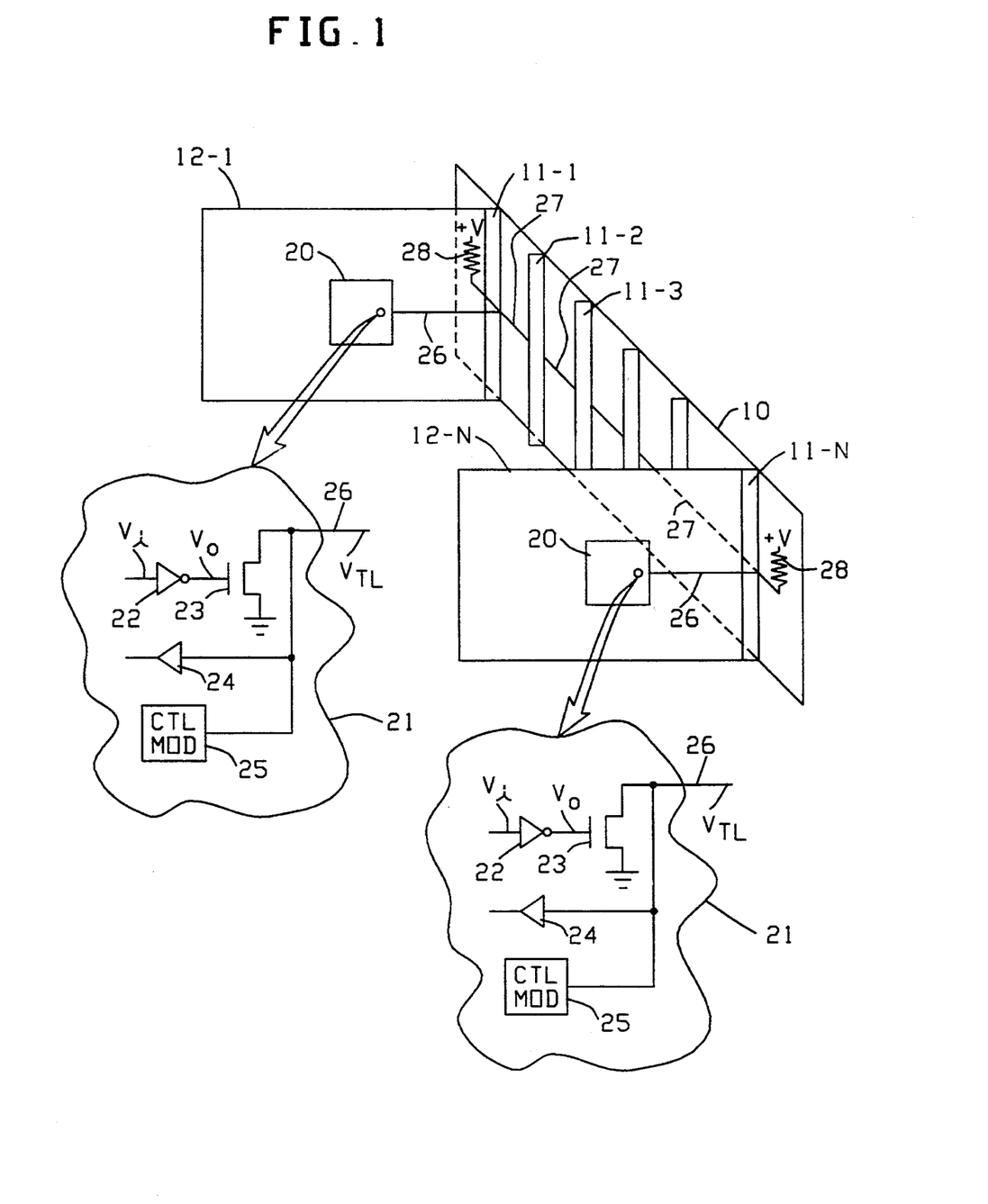
FIG. 1 shows a transmission line in a digital system which has multiple transmitters and receivers, and which in accordance with the invention includes a control module with each transmitter that reduces ringing.

Referring now to FIG. 1, a preferred embodiment of the present invention will be described. In FIG. 1, reference numeral 10 identifies a backplane; reference numerals 11-1, 11-2, ... thru 11-N identify "N" connectors on the backplane 10; and reference numerals 12-1 and 12-N identify two printed circuit boards which plug into the two end connectors 11-1 and 11-N. Similar printed circuit boards also plug into each of the other connectors; but for the sake of simplifying FIG. 1, those printed circuit boards are not shown.

Each of the printed circuit boards in each of the connectors 11-1 thru 11-N contains an integrated circuit chip 20, and a portion of the chip circuitry is shown in FIG. 1 as circuit 21. That circuit 21 includes a transmitter 22, an N-channel transistor 23, a receiver 24, and a control module 25.

All of the components 22–25 are interconnected as shown to a conductor 26 on their respective printed circuit board. Each conductor 26 forms a branch of a transmission line, the main section of which is formed by a conductor 27 which runs along the backplane 10 to all of the connectors 11-1 thru 11-N. This main section of the transmission line is terminated at its two ends by respective resistors 28 on the backplane 10 which are connected to a supply voltage $+V$.

To understand the operation of the FIG. 1 circuit, consider the situation where the input signal $V_i$ to each of the transmitters 22 is a high digital voltage, such as $+V_{DD}$. In that case, the output signal $V_O$ from each of the transmitters 22 will also be low, and thus each of the transistors 23 will be OFF. As a result, the voltage on the transmission line conductors 26 and 27 will equal the supply voltage $+V$.

Thereafter, when the input signal $V_i$ to one of the transmitters 22 goes to a low digital voltage, that transmitter will cause its corresponding transistor 23 to turn ON. Thus a current will flow through the ON transistor 23, and the voltage on the transmission line conductors 26 and 27 will be reduced to nearly zero volts or ground. Later, when the input signal $V_i$ to the transmitter 22 is returned to the high digital voltage, the corresponding transistor 23 will turn OFF, and thus the voltage on the transmission line conductors 26 and 27 will return to $+V$ volts.

Now a problem with the above operating sequence is that a parasitic inductance, parasitic capacitance, and parasitic resistance is inherently incorporated into each of the components which make up and are connected to the transmission line. This is shown in FIG. 2 wherein reference numeral 26P identifies the parasitic components for conductor 26; reference numeral 20P identifies the parasitic components of the chip 20 which are connected to conductor 26; reference numeral 11P identifies the parasitic components for the connector 11; and reference numeral 27P identifies the parasitic components for the portion of the backplane conductor 27 which extends between two adjacent connectors.

Due to the above parasitic components, the transmission line voltage does not change as a step function when it switches from ground to $+V$ volts; but instead, the transmission line voltage rings during that transition. And, with the present invention, that ringing is substantially reduced by the control module 25.

Figure 2:
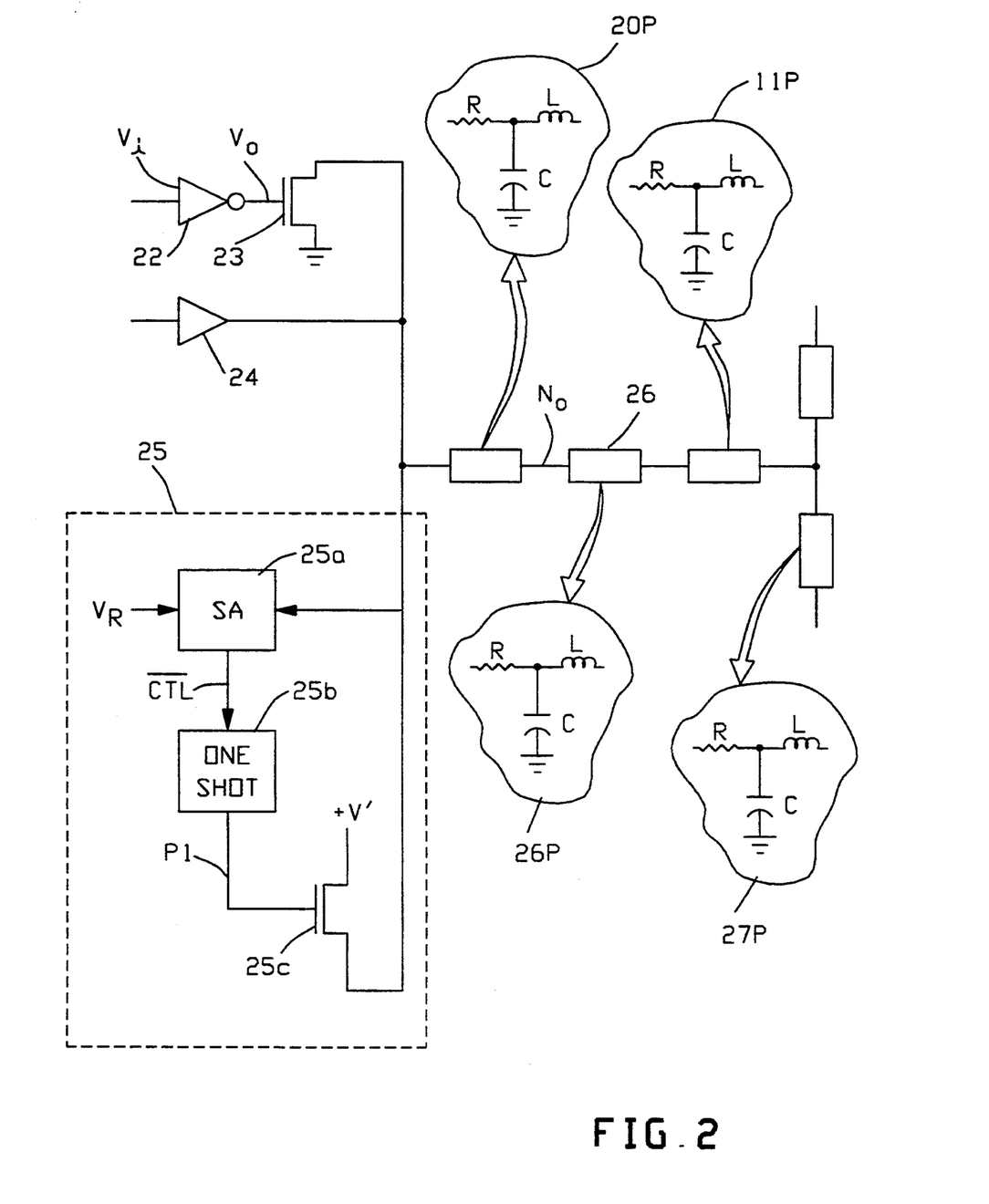
FIG. 2 shows the main parts of the control module of FIG. 1, along with several parasitic components on the transmission line.

As shown in FIG. 2, the control module 25 is comprised of a sense amplifier 25a, a pulse generating one-shot circuit 25b, and an N-channel field effect transistor 25c. These components 25a–25c are interconnected as shown. In operation, the sense amplifier 25a compares the voltage on the transmission line with a reference voltage $V_R$. All transmission line voltages which are less positive than the reference voltage VR are considered to be a digital low voltage, and all transmission line voltages which are more positive than the reference voltage $V_R$ are considered to be a digital high voltage.

When the sense amplifier 25a senses that the transmission line voltage changes from a low level voltage to a high level voltage, that sense amplifier generates a low control signal $\overline{CTL}$, and it sends the $\overline{CTL}$ signal to the one-shot circuit 25b. In response, the one-shot circuit 25b generates a single positive pulse P1 which it sends to the gate of the transistor 25c. While this pulse P1 occurs, the transistor 25c turns ON and thereby couples the supply voltage $+V'$ to the transmission line conductors 26 and 27.

Figure 3:
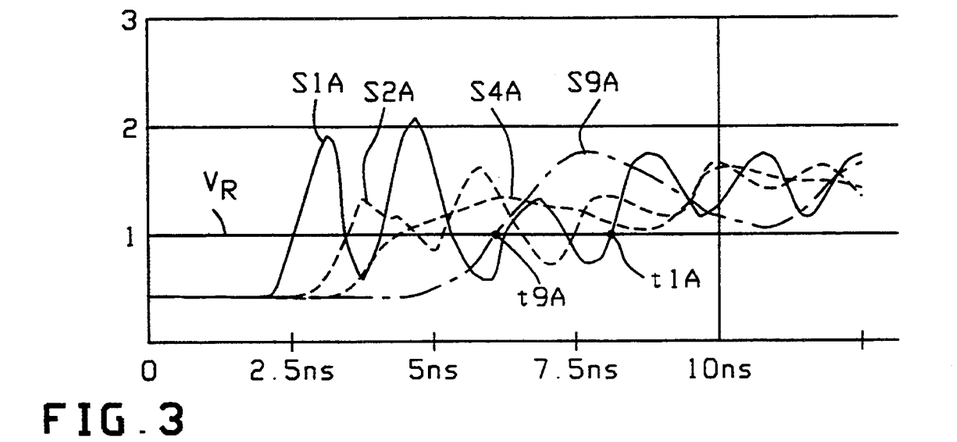
FIG. 3 is a computer simulation plot which shows various signals that occur on the FIG. 1 transmission line when the control module is not present.
Figure 4:
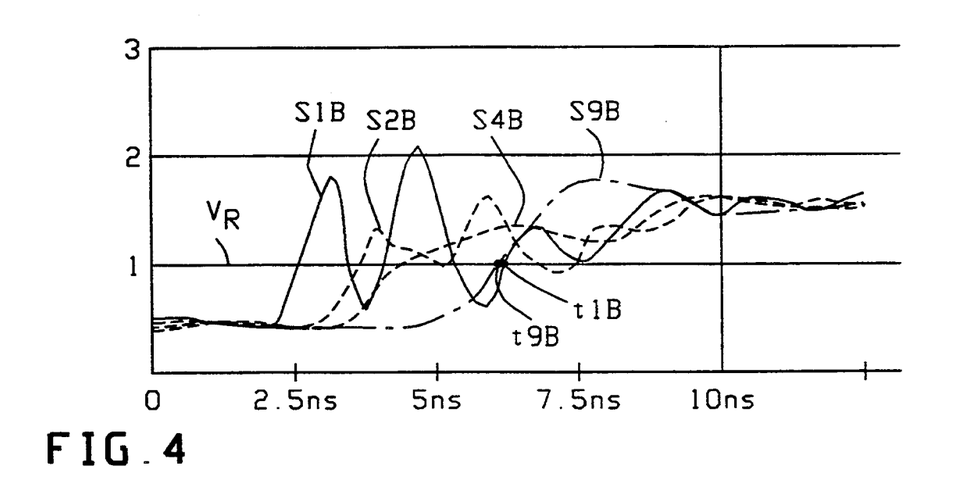
FIG. 4 is a computer simulation plot which shows various signals that occur on the FIG. 1 transmission line when the control module is present.

To determine the degree by which the circuit 25 reduces ringing on the transmission line, the operation of the circuits in FIGS. 1 and 2 was simulated on a computer; and the results of that simulation is shown in FIGS. 3 and 4. For comparison purposes, FIG. 3 shows the simulation results when the control module 25 is removed, and FIG. 4 shows the simulation results with the control module 25 included. In this simulation, the values which were used for all of the parasitic components are listed in Table 1 below. Also in this simulation, the transmission line termination resistors 28 were 45 ohms; the transmission line supply voltage $+V$ was 1.5 volts; the reference voltage $V_R$ for the sense amplifiers was 1.0 volts; and the supply voltage $+V'$ in the control module 25 was 4.5 volts.

TABLE 1

|     | L | C | R |
| --- | --- | --- | --- |
| 20P | 18 nanohenry | 12 picofarad | 2 ohms |
| 11P | 0.66 nanohenry | 0.36 nanohenry | 2 milliohms |
| 26P | 0.79 nanohenry per 0.1 inch times 1.5 inches | 0.32 picofarad per 0.1 inch times 1.5 inches | 6 milliohms per 0.1 inch times 1.5 inches |
| 27P | 0.79 nanohenry per 0.1 inch times 1.0 inches | 0.32 picofarad per 0.1 inch time 1.0 inches | 6 milliohms per 0.1 inch times 1.0 inches |

In FIGS. 3 and 4, time is shown on the horizontal axis in nanoseconds, and voltage is shown on the vertical axis in volts. Also in FIGS. 3 and 4, the initial conditions prior to time zero are: a) transistor 23 on the first printed circuit board 12-1 is ON, and b) transistor 23 on all of the other printed circuit boards is OFF. For the FIG. 3 and 4 simulation, the total number of printed circuit boards is nine (i.e. N=9).

At time t=0 in FIGS. 3 and 4, transistor 23 on the printed circuit board 12-1 turns OFF. In response, a signal S1A in FIG. 3 shows how the voltage at node $N_o$ in FIG. 2 varies on the first printed circuit board 12-1. Similarly in FIG. 3, a signal S2A shows how the voltage at node $N_0$ varies on the second printed circuit board 12-2; a signal S4A shows how the voltage at node $N_0$ varies on the fourth printed circuit board 12-4; and a signal S9A shows how the voltage at node $N_0$ varies on the ninth printed circuit board 12-9. Again, these signals S1A, S4A, and S9A occur when the control module 25 is not present.

By comparison, a signal S1B in FIG. 4 shows how the voltage varies at node No on the printed circuit board 12-1 when the control circuit 25 is included. Likewise, the signals S2B, S4B, and S9B respectively show how the voltage at node $N_0$ varies on the printed circuit boards 12-2, 12-4, and 12-9 when the control circuit 25 is included.

From FIG. 3, it is seen that the signal S1A does not stay above the reference voltage $V_R$ until after time instant t1A which occurs at about 8 nanoseconds. By comparison, inspection of FIG. 4 shows that signal S1B stays above the reference voltage after time instant t1B which occurs at about 6.2 nanoseconds. Thus, this time difference of 8 nanoseconds vs. 6.2 nanosecond represents a speed increase of about 29%.

Also, another important point which is seen from FIGS. 3 and 4 is the relative time at which the node $N_0$ voltage stays above the reference voltage on the first and last printed circuit boards. In FIG. 3, signal S9A stays above the reference voltage after t9A (which occurs at about 6 nanoseconds), but signal S1A continues to drop below the reference voltage until t1A (which occurs at about 8 nanoseconds). By comparison, in FIG. 4, signal S9B stays above the reference voltage after time t9B (which again occurs at about 6 nanoseconds), and signal S1B stays above the reference voltage at about the same time t1B (t1B~t9B).

The above times t9A and t9B are determined by the length of the transmission line, and so they provide an upper time limit on when the signals on all of the other nodes $N_0$ should be settled. Thus in FIG. 3, the difference t1A minus t9A is wasted time. But in FIG. 4, the difference t1B minus t9B is essentially zero, so there is no wasted time.

In FIG. 3, the ringing which occurs in signal S1A, can be explained as follows. Prior to time 0, a current flows from the supply voltage +V through the transistor 23 which is turned ON in the printed circuit board 12-1. Thus, current flows through all the parasitic inductors on the backplane 10 as well as the parasitic inductors for the printed circuit boards 12-1 and 12-N and their connectors. Then, as transistor 23 on the printed circuit board 12-1 starts to turn OFF at time "0", all of the parasitic inductors which are passing current generate a voltage with a polarity which tries to maintain the current flow. Consequently, a large overshoot occurs in the signal S1A at a time of about t=3 nanoseconds. This large voltage overshoot then travels down the conductor 26 on the printed circuit board 12-1 until it reaches a node where the impedance of the transmission line significantly changes. Such a change initially occurs at the connector 11-2 since at that point, the transmission line splits in two and thus its impedance gets cut approximately in half. This change in impedance then causes a reflection which travels back to the printed circuit board 12-1 and there reaches the node $N_O$ at a time of about t=3.5 nanoseconds.

By comparison, in FIG. 4, the signal S1B also has the same initial overshoot which occurs at a time of about t=3 nanoseconds. That overshoot then travels down the conductor 26 and on to the backplane where it reaches the connector 11-2 and then reflects back to node $N_0$ on the printed circuit board 12-1. However, while that reflection is occurring, the control circuit 25 generates the pulse P1 which couples the supply voltage +V' onto the conductor 26 on the printed circuit board 12-1. This gating of the supply voltage +V' on the printed circuit board 12-1 occurs in FIG. 4 from time t=3 nanoseconds to time t=10 nanoseconds and its effect is to keep node $N_O$ charged on the printed circuit board 12-1 which thereby reduces ringing at that node.

Also, the control circuit 25 which is on each of the other printed circuit boards in the connectors 11-2, 11-3, etc., behave in a similar fashion. That is, the sense amplifier 25a in combination with the one shot circuit 25b generate the pulse P1 when the signal on node $N_0$ makes its initial transition from a digital low voltage to a digital high voltage; and during that pulse, transistor 25c couples the supply voltage +V' back on to the node $N_0$. As a result, the ringing on the transmission line conductors 26 and 27 is reduced further and further as the low to high voltage transition on those conductors travels from one printed circuit board to another. By inspection of the signals S2B in FIG. 4, it is seen that all ringing below the reference voltage is eliminated when the initial low voltage to high voltage transition is sent from one board to the adjacent board.

Figure 5:
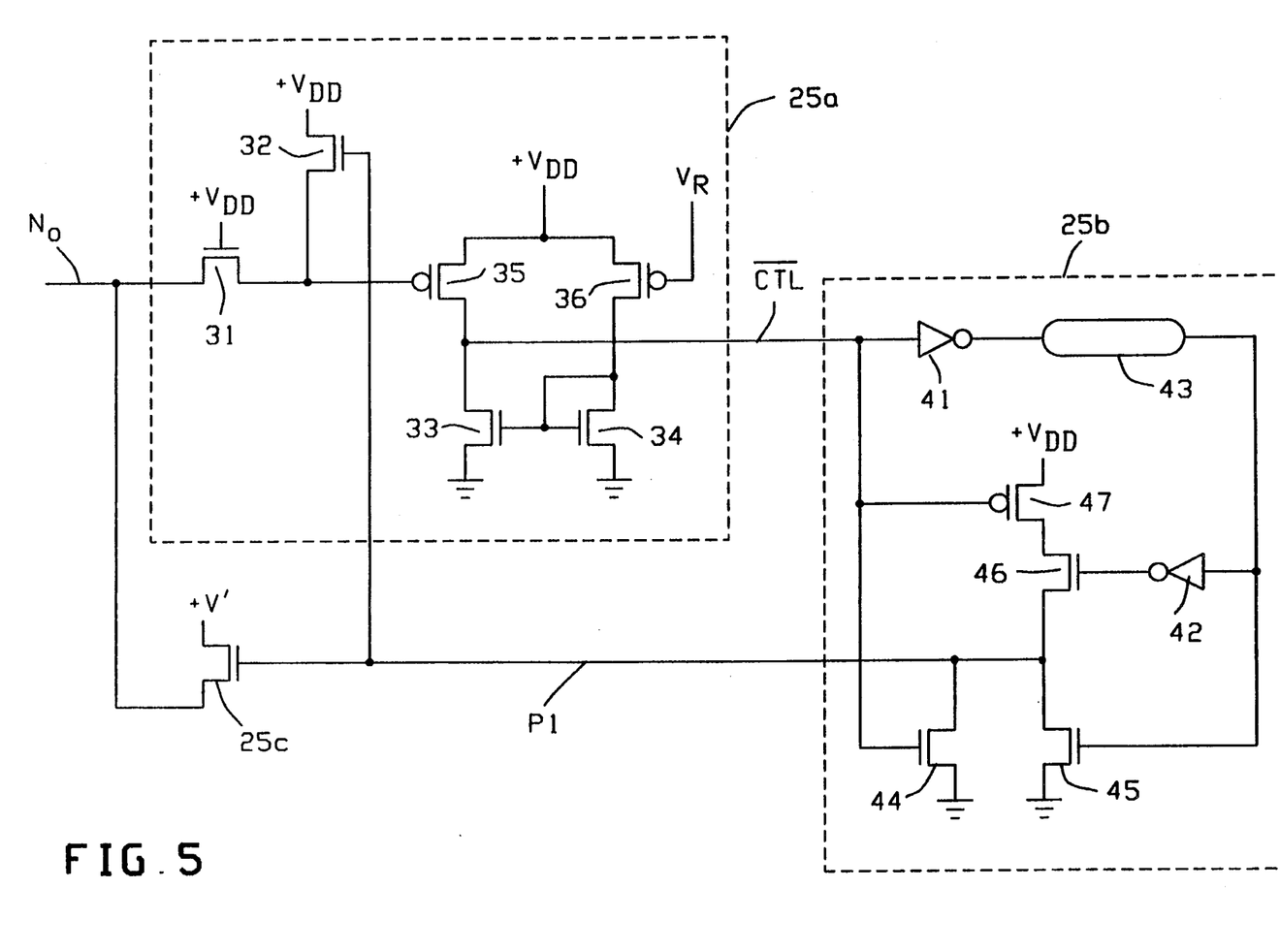
FIG. 5 is a detailed circuit diagram of one preferred embodiment of the control module of FIGS. 1 and 2.

Considering now FIG. 5, a preferred internal structure will be described for the sense amplifier 25a and one shot circuit 25b of the control module 25. This particular FIG. 5 structure was used to obtain the previously described simulation results of FIG. 4. In FIG. 5, the sense amplifier 25a consists of four N-channel transistors 31–34 and two P-channel transistors 35–36, all of which are interconnected as shown. Also, the one shot circuit 25b consists of two inverters 41–42, a delay line 43, three N-channel transistors 44–46, and one P-channel transistor 47 which are interconnected as shown.

Initially, when the transmission line voltage at node $N_0$ is low, transistor 35 is ON. Thus, the control signal $\overline{CTL}$ is at high voltage level. As a result, transistor 47 is OFF; transistor 46 is ON; transistor 45 is OFF; transistor 44 is ON; and transistor 25c is OFF. Thus the pulse signal P1 on the gate of transistor 25c is at a low voltage level (i.e.—the pulse signal is false).

Thereafter, the transmission line voltage on node $N_0$ changes to a high voltage level. In response, transistor 35 turns OFF, and so the high voltage level of the control signal $\overline{CTL}$ changes to a low voltage level. Consequently, transistor 44 turns OFF and transistor 47 turns ON. With both of the transistors 47 and 46 being ON, the pulse signal P1 goes true (i.e.—signal P1 changes to a high voltage level). Thus transistor 25c turns ON, and that couples the supply voltage +V' to the node $N_0$.

Next, the low voltage control signal $\overline{CTL}$ passes through the inverter 41 which generates a high voltage level, and that high voltage level then passes through the delay line 43. When that occurs, transistor 45 turns ON and transistor 46 turns OFF. This causes the pulse signal P1 to go false (low), which in turn causes transistor 25c to turn OFF and thereby decouple the supply voltage +V' from node $N_0$.

Figure 6:
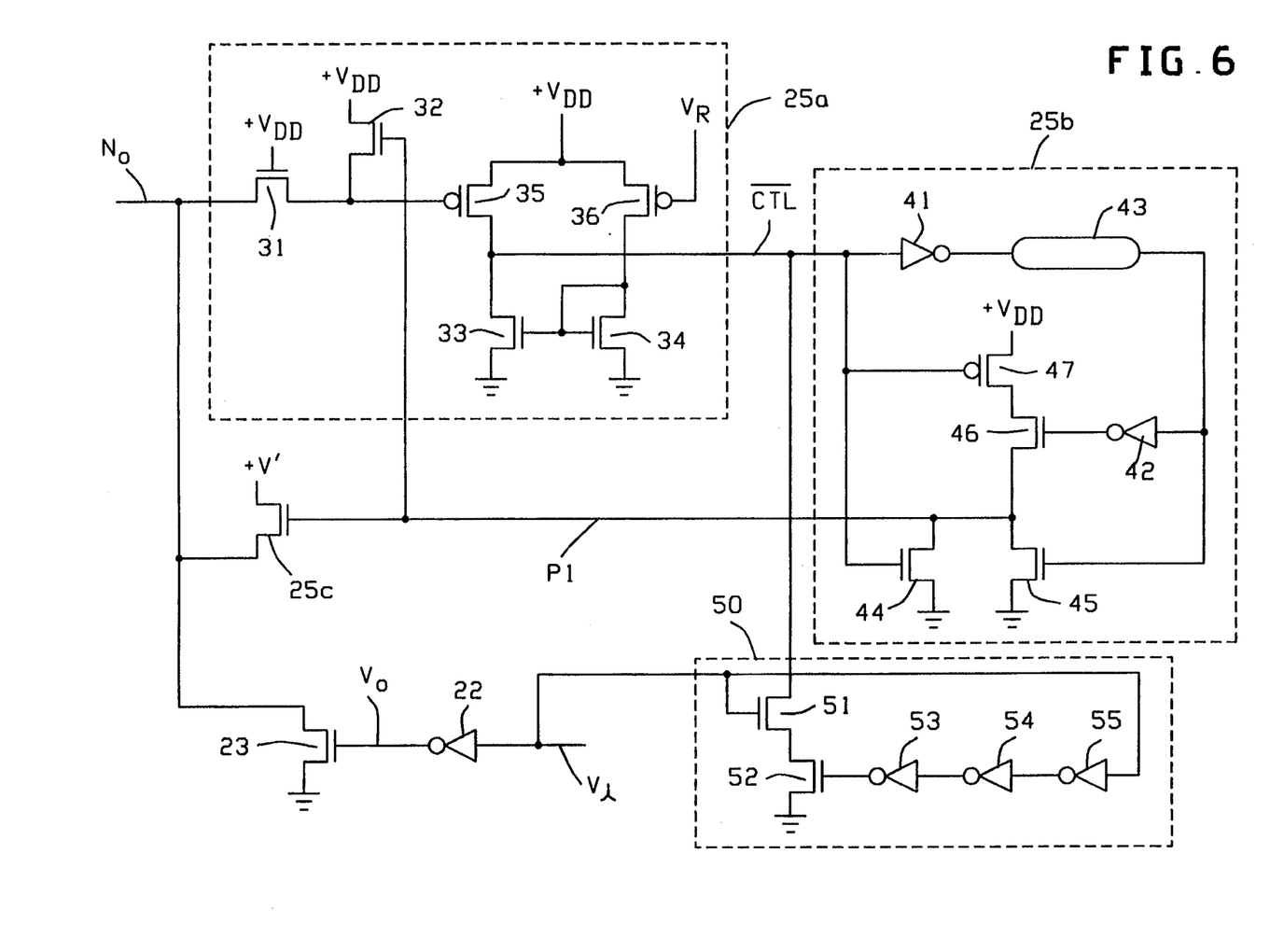
FIG. 6 is a detailed circuit diagram of the FIG. 5 control module to which a speed up circuit has been added.

Turning now to FIG. 6, a modification to the FIG. 5 control circuit will be described. With this modification, all of the components 31–36 in the sense amplifier 25a remain the same; all of the components 41–47 in the one shot circuit 25b remain the same; and an additional speed up circuit 50 is provided. This speed up circuit 50 consists of two N-channel transistors 51–52 and three inverters 53–55. All of the components 51–55 are interconnected to the sense amplifier 25a; the one shot circuit 25b, and the previously described transmission line transmitter 22 as shown.

To understand the operation of the FIG. 6 embodiment, consider the initial condition where the input signal $V_i$ to the transmission line transmitter 22 is low. In that state, transistor 51 is OFF and transistor 52 is ON. Also in the initial state, transmitter 22 generates a high output signal $V_0$ which turns ON transistor 23, and thus a low voltage signal occurs on the transmission line node No- In response, a) transistor 35 turns ON, b) the control signal $\overline{CTL}$ is generated as a high voltage level, c) transistors 44, 46, and 52 turn ON, and d) transistors 45 and 47 turn OFF.

Thereafter, the transmitter input signal switches from a low voltage level to a high voltage level. In response, transistor 51 of the speed up circuit 50 turns ON; and, since transistor 52 is already ON, the control signal $\overline{CTL}$ goes to a low voltage level. This low, $\overline{CTL}$ signal causes transistor 47 to turn ON; that causes the pulse signal P1 to go true (high); and that couples the supply voltage +V' through the transistor 25c to the node N$_0$. Thus, due to the speed up circuit 50, the control signal $\overline{CTL}$ on the transmitting node N$_0$ is forced low before the sense amplifier 25a can sense a low to high voltage transition on the transmission line node N$_0$. Then, after a delay that is imposed by the three inverters 53–55, transistor 52 turns OFF which enables the sense amplifier 25a to continue the generation of the low $\overline{CTL}$ signal as previously described.

Figure 7:
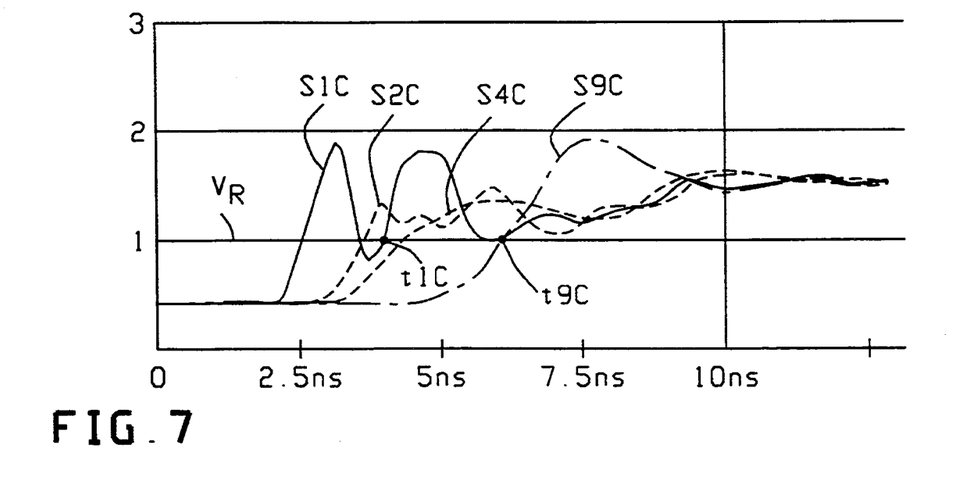
FIG. 7 is a computer simulation plot which shows various signals that occur on the FIG. 1 transmission line when the FIG. 6 circuit is used as the control module.

This operation of the FIG. 6 circuit was simulated by a computer, and the results of that simulation are shown in FIG. 7. For this simulation, the values of the parasitic components, the resistors 28, and supply voltages +V and +V' were as previously used in the simulation of FIGS. 3 and 4. In FIG. 7, signals S1C, S2C, S4C, and S9C respectively show the voltage on node N$_0$ for the first, second, fourth, and ninth (last) printed circuit board.

Inspection of FIG. 7 shows that signal S9C stays above the reference voltage after time t9C (which occurs at about 6 nanoseconds); and signal S1C stays above the reference voltage after time t1C (which occurs at about 4 nanoseconds. Further, none of the other signals S2C or S4C have transitions below the reference voltage after time t9C. Thus, with the FIG. 6 circuit, the voltage on all of the nodes N$_0$ is high by the time one low to high transition travels the full length of the transmission line.

Figure 8:
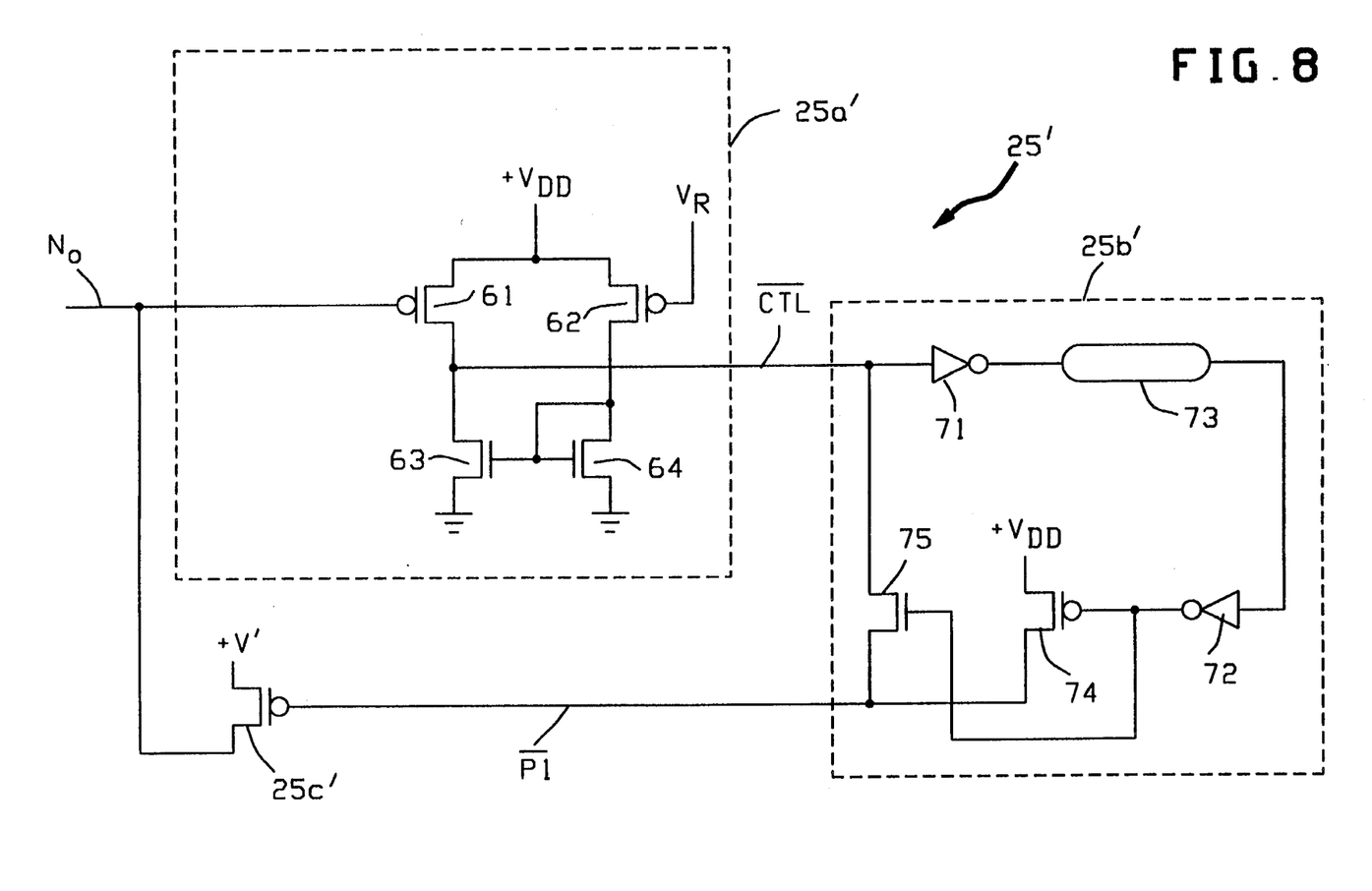
FIG. 8 is a detailed circuit diagram of another embodiment for the control module in FIG. 1; and, FIG. 9 is a detailed circuit diagram of still another embodiment for the control module in FIG. 1.

Turning now to FIG. 8, the details of another control module 25' will be described. This module 25' includes a sense amplifier 25a', a one shot circuit 25b', and a P-channel transistor 25c' all of which are interconnected to each other and to the transmission line node N$_0$ as shown. Sense amplifier 25a' consists of two P-channel transistors 61–62, and two N-channel transistors 63–64. Circuit 25b' consists of two inverters 71–72, a delay line 73, a P-channel transistor 74, and an N-channel transistor 75.

To understand the operation of the FIG. 8 control module, consider the initial condition where the transmission line voltage on node N$_0$ is low. In that case, transistor 61 is ON, and thus the control signal $\overline{CTL}$ is at a high voltage level. That high $\overline{CTL}$ signal passes through the inverter 71, the delay line 73, and the inverter 72 to thereby turn OFF transistor 74 and turn ON transistor 75. Since transistor 75 is ON, the high signal $\overline{CTL}$ passes through that transistor to thereby force the pulse signal $\overline{P1}$ to a high voltage level. In response to the high $\overline{P1}$ signal, transistor 25c' turns OFF.

Thereafter, the transmission line voltage on node N$_0$ switches from a low voltage level to a high voltage level. In response, transistor 61 turns OFF which causes the control signal $\overline{CTL}$ to go to a low voltage level. That low $\overline{CTL}$ signal then passes through transistor 75 to thereby make the pulse signal $\overline{P1}$ go low (or true). Thus, transistor 25c' turns ON and thereby couples the supply voltage +V to the transmission line node N$_0$.

In order for the above coupling of the supply voltage +V to the node N$_0$ to occur, only two of the transistors 61 and 25c' had to change state (i.e.—turn ON or OFF). This is in comparison to the previously described control module 25 of FIG. 5 wherein three of the transistors 35, 47, and 25c had to switch ON or OFF, to initially couple the supply voltage +V' to the transmission line node N$_0$. Thus the FIG. 8 control module couples the supply voltage to the transmission line faster than the FIG. 5 control module, and that further reduces ringing on the transmission line.

Thereafter, the low voltage level of the control signal $\overline{CTL}$ passes through inverter 71, delay line 73, and inverter 72. When that occurs, transistor 75 turns OFF while transistor 74 turns ON. In response, the pulse signal $\overline{P1}$ goes to a high voltage level (goes false) and that causes transistor 25c to turn OFF and decouple the supply voltage +V from the node N$_0$. Several preferred embodiments of the invention have now been described in detail. In addition however, many changes and modifications can also be made to these details without departing from the nature and spirit of the invention.

Figure 9:
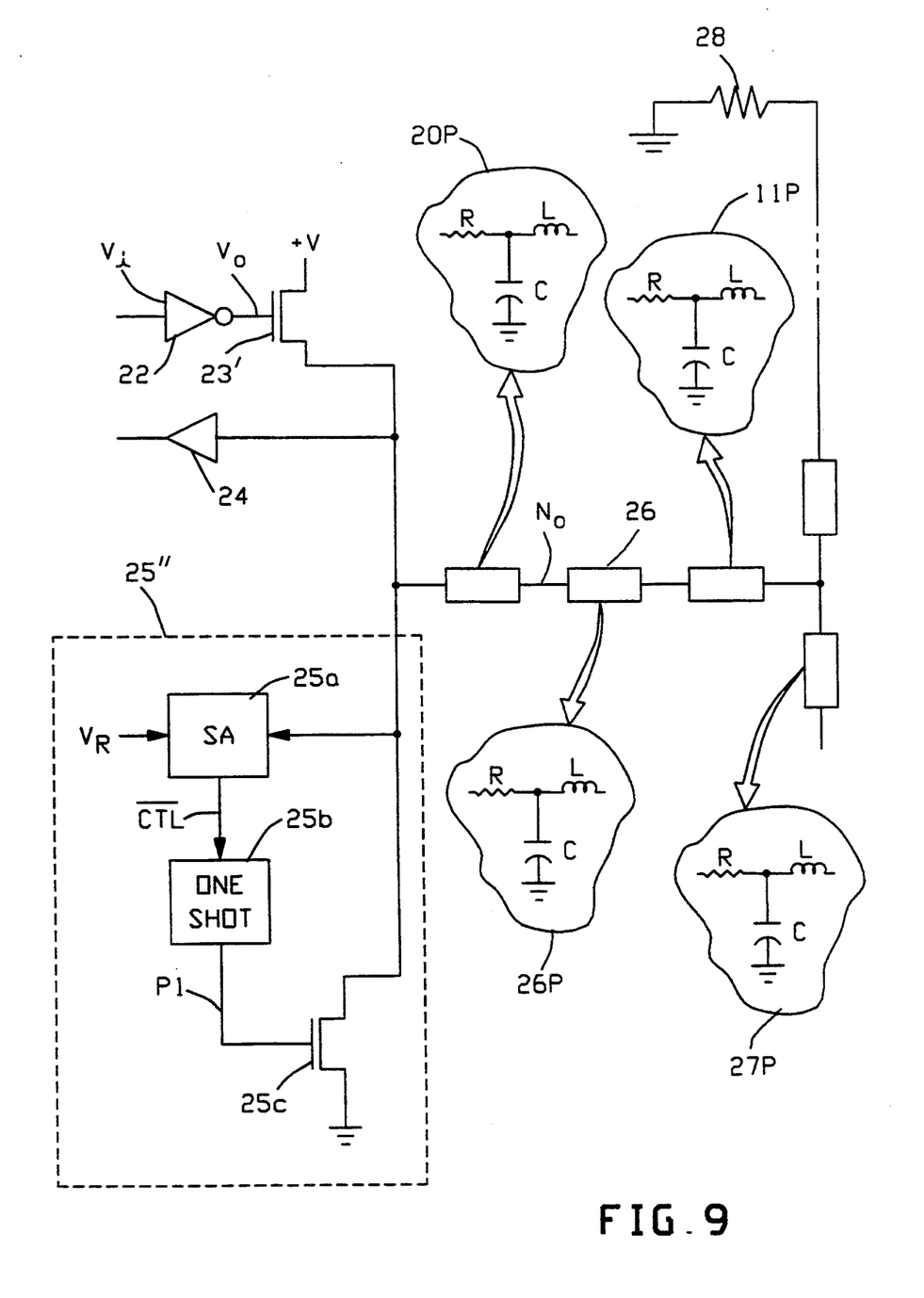

For example, FIG. 9 shows a modification to the embodiments of FIGS. 1 and 2 wherein the two resistors 28 at the ends of the transmission line are terminated to ground (rather than the voltage +V), and each of the transistors 23 couples the voltage +V (rather than ground) to the transmission line. With this modification, signals on the transmission line conductors 26 and 27 ring when they switch from the high voltage level to a low voltage level (rather than when they switch from a low voltage to a high voltage level).

To reduce the above ringing, a control module 25" is provided as shown in FIG. 9, and it operates as follows. Initially, consider the case where the output signal V$_0$ from transmitter 22 is at a high voltage level and thus transistor 23 is ON. When that occurs, current flows through transistor 23 and through the inductors of the previously described parasitic components 20P, 26P, 11P, and 27P.

Thereafter, when the output signal V$_0$ from transmitter 22 switches to a low voltage level, transistor 23 turns OFF. In response, the inductors in the parasitic components 20P, 26P, 11P, and 27P try to maintain their current flow by generating respective voltage which cause the voltage at node N0 to drop below ground. This below ground voltage at node N0 then travels down the conductor 26 to the backplane conductor 28 whereupon various impedance changes are encountered which in turn produce a reflected voltage that goes above ground at node N$_0$.

In FIG. 9, the above ground reflection at node N0 is reduced by the control module 25". It contains the same sense amplifier 25a, same one shot circuit 25b, and the same transistor 25c as was previously described in conjunction with FIG. 5. However, in the FIG. 9 control module, transistor 25c couples ground to node N$_0$; and a control signal CTL (which is the inverse of the control signal $\overline{CTL}$ in FIG. 5) goes from the sense amplifier 25a to the one shot 25b. This inverse control signal CTL is generated by the FIG. 5 circuit on the interconnection between transistors 36 and 34.

Signal CTL makes a high voltage to low voltage transition, which triggers the one shot circuit 25b, when the transmission line voltage on node N$_0$ changes from a level above the reference voltage V$_R$ to a level below the reference voltage. In response, the one shot circuit 25b generates a single positive pulse P1 which turns ON transistor 25c, and that couples node N$_0$ to ground which thereby reduces ringing at the ground level.

As another modification, suppose that the output signal V$_0$ from the transmitter 22 in FIGS. 1 and 2 change state in synchronization with a cyclic clock signal (not shown). In that case, the maximum width of the pulse signal P1 plus the time delay from the first to the last node $N_0$ along the transmission line should be no more than the time duration of one clock cycle. This is because the supply voltage $+V'$ must be decoupled from all nodes along the transmission line at the start of each transmission. To meet this constraint with a margin of safety, the delay line 43 preferably has a nominal delay of one-half the clock cycle.

As still another modification, a respective control module 25 need not be provided at every node $N_0$ on the transmission line which has a transmitter and/or receiver. Instead, in order to reduce the total number of control modules 25, one such module can be provided for each subset of one to five of the transmitter/receiver nodes $N_0$.

Also, as another modification, all or part of the sense amplifier 25a in FIG. 2 can be integrated into the receiver 24 in order to save on the total number of transistors. For example, the receiver 24 can include a circuit which compares the node N0 voltage with the reference voltage $V_R$, just like the circuit of transistors 31–36 of FIG. 5. In that case, the control signal $\overline{CTL}$ can come from the receiver and the transistors 31–36 need not be duplicated.

Accordingly, it is to be understood that the invention is not limited to the details of any one particular embodiment which has been described above but is defined by the appended claims.

What is claimed is:

1. An electronic control module that reduces ringing in a digital voltage signal on a transmission line which has multiple transmitters, receivers, and parasitic inductors and capacitors coupled thereto; said module comprising:
   a sensing circuit having an input coupled to said transmission line, which senses when said digital voltage signal on said transmission line changes from a first voltage range to a second voltage range, and generates a control signal to indicate same;
   a pulse generating circuit, having an input which receives said control signal and in response thereto generates a single pulse; and,
   a switching circuit, having an input which receives said pulse and an output connected to said transmission line, which couples a supply voltage in said second voltage range to said transmission line while said pulse occurs.

2. The invention of claim 1, in a system, wherein for each of said transmitters, a respective one of said modules is provided.

3. The invention of claim 1, in a system, wherein for each subset of two to five of said transmitters, a respective one of said modules is provided.

4. The invention of claim 1, in a system, wherein said digital voltage signal changes from said first voltage range to said second voltage range and vice versa in synchronization with a cyclic clock signal, and wherein said pulse generating circuit generates said pulse with a width of less than one half of the clock cycle.

5. The invention of claim 1 wherein said transmission line has one main section with multiple branches extending therefrom, and wherein said parasitic inductors and capacitors change in magnitude by at least 50% from any branch to said main section.

6. The invention of claim 5 wherein each branch has a certain signal propagation delay; and wherein said sensing circuit, pulse generating circuit, and switching circuit operate to couple said supply voltage to said transmission line in less than twice said propagation delay.

7. The invention of claim 5 wherein each branch has a certain signal propagation delay; and wherein said sensing circuit, pulse generating circuit, and switching circuit operate to couple said supply voltage to said transmission line within said propagation delay.

8. The invention of claim 1 wherein said sensing circuit, pulse generating circuit, and switching circuit are comprised of transistors; and only two of said transistors turn ON/OFF to initially couple said supply voltage to said transmission line.

9. The invention of claim 1 and further including a speed-up circuit, having an input coupled to an input on one of said transmitters and an output coupled to said input of said pulse generating circuit, which generates said control signal when said one transmitter receives an input signal for transmission that causes said transmission line voltage change.

10. The invention of claim 1 wherein said pulse is a positive pulse, and said switching circuit is a single N-channel transistor which receives said positive pulse and turns-ON in response thereto.

11. The invention of claim 1 wherein said pulse is a negative pulse, and said switching circuit is a single P-channel transistor which receives said negative pulse and turns-ON in response thereto.

12. The invention of claim 1 wherein said second voltage range is more positive than said first voltage range.

13. The invention of claim 1 wherein said first voltage range is more positive than said second voltage range.

* * * * *